US012796029B2

(12) United States Patent
Droldner et al.

(10) Patent No.: US 12,796,029 B2
(45) Date of Patent: Nov. 10, 2026

(54) SEMICONDUCTOR DEVICE

(71) Applicant: Infineon Technologies Bipolar GmbH & Co. KG, Warstein (DE)

(72) Inventors: Markus Droldner, Ahlen (DE); Christof Drilling, Winterberg (DE); Uwe Kellner-Werdehausen, Leutenbach (DE); Sebastian Paul Sommer, Castrop-Rauxel (DE); Michael Stelte, Borchen (DE)

(73) Assignee: Infineon Technologies Bipolar GmbH & Co. KG, Warstein (DE)

( * ) Notice: Subject to any disclaimer, the term of this patent is extended or adjusted under 35 U.S.C. 154(b) by 583 days.

(21) Appl. No.: 18/364,149

(22) Filed: Aug. 2, 2023

(65) Prior Publication Data

US 2024/0063265 A1 Feb. 22, 2024

(30) Foreign Application Priority Data

Aug. 16, 2022 (DE) ......................... 102022120612.2

(51) Int. Cl.
*H10D 62/13* (2025.01)
*H10D 18/00* (2025.01)
(Continued)

(52) U.S. Cl.
CPC ......... *H10D 62/148* (2025.01); *H10D 18/211* (2025.01); *H10D 64/233* (2025.01); *H10D 64/291* (2025.01)

(58) Field of Classification Search
None
See application file for complete search history.

(56) References Cited

U.S. PATENT DOCUMENTS 4,223,332 A 9/1980 Sittig
4,281,336 A 7/1981 Sommer et al.
(Continued)

FOREIGN PATENT DOCUMENTS

DE 2917786 A1 11/1980
DE 10333798 B4 11/2018
(Continued)

OTHER PUBLICATIONS

Tsyplakov, Evgeny, et al., "Sacrificial Bypass Thyristor for MMC applications", Abb Power Grids Switzerland Ltd., 2020, pp. 1-3.
(Continued)

*Primary Examiner* — Xiaoming Liu
(74) *Attorney, Agent, or Firm* — Murphy, Bilak & Homiller, PLLC

(57) ABSTRACT

A semiconductor device includes a semiconductor body having opposite first and second surfaces, a gate region, and an active region arranged adjacent to the gate region in a horizontal direction. A first emitter, a first base, and a second base are arranged consecutively between the second and first surfaces in a vertical direction. A front-facing emitter is arranged in the active region and extends in the vertical direction from the first surface to the second base. Short-circuit regions extend from the first surface through the front-facing emitter to the second base. The active region has, in the horizontal direction, a first edge region adjacent to the gate region, a failure region adjacent to the first edge region, and a second edge region adjacent to the failure region. An average density of the short-circuit regions in the failure region is lower than in both edge regions.

21 Claims, 8 Drawing Sheets

(51) Int. Cl.
*H10D 64/23* (2025.01)
*H10D 64/27* (2025.01)

(56) References Cited

U.S. PATENT DOCUMENTS

| | | | | |
|---|---|---|---|---|
| 6,727,526 | B1 | 4/2004 | Niedernostheide et al. | |
| 9,741,839 | B1 | 8/2017 | Nakagawa | |
| 2005/0258448 | A1* | 11/2005 | Barthelmess | H10D 62/104 257/107 |
| 2012/0211799 | A1 | 8/2012 | Liu et al. | |
| 2021/0036136 | A1* | 2/2021 | Schenk | H10D 62/148 |
| 2024/0038880 | A1* | 2/2024 | Vobecky | H10D 18/221 |

FOREIGN PATENT DOCUMENTS

| | | | |
|---|---|---|---|
| DE | 102019124695 | A1 | 2/2021 |
| DE | 102018102234 | B4 | 5/2021 |
| EP | 0220698 | A2 | 5/1987 |
| EP | 0439003 | A1 | 7/1991 |
| EP | 2100368 | B1 | 9/2011 |
| EP | 3646376 | B1 | 9/2020 |
| GB | 2033661 | A | 5/1980 |
| JP | S51136290 | A | 11/1976 |
| JP | 2003017512 | A | 1/2003 |
| WO | 2013044961 | A1 | 4/2013 |
| WO | 2019011717 | A1 | 1/2019 |
| WO | 2021165483 | A1 | 8/2021 |

OTHER PUBLICATIONS

Wikström, Tobias, et al., “An 8.5kV Sacrificial Bypass Thyristor with Unprecedented Rupture Resilience”, 2019 31st International Symposium on Power Semiconductor Devices and ICs (ISPSD), 2019, pp. 491-494.

* cited by examiner

SEMICONDUCTOR DEVICE

TECHNICAL FIELD

The invention relates to a semiconductor device, in particular a semiconductor device for protecting a converter in the event of a fault.

BACKGROUND

Power semiconductor modules, such as IGBT (Insulated Gate Bipolar Transistor) modules, typically have one or more freewheeling diodes. Silicon carbide (SiC) diodes are increasingly used as freewheeling diodes. This enables the power density to be significantly increased, for example, in converters for use in solar or wind power plants. However, the freewheeling diodes, in particular silicon carbide diodes, only have a low overload capability. In the event of a fault, a very high short-circuit current can occur, which can cause explosion of the freewheeling diodes, allowing highly conductive plasma to escape, which can lead to successive short circuits in the converter. This can cause a fire in the affected system and ultimately lead to a total failure.

Power semiconductor modules therefore often have mechanical protective elements, such as magnetic circuit breakers or fusible conductors, which switch the module off in the event of a short circuit. However, such protective elements, with switching times of around 500 μs, are relatively slow and can therefore not always shut down a module in time in the event of a fault, so that damage to the module cannot be reliably prevented. Significantly faster switching times (e.g. <20 μs) can be achieved with semiconductor devices that short-circuit the grid in a controlled manner in the event of a fault, thereby switching off the power semiconductor module reliably and in good time and preventing damage to the power semiconductor module due to fault currents. Due to the high residual currents occurring in the event of a fault, however, a plasma can form in such semiconductor devices, which can lead to faults or even failures of the power semiconductor module if it is unintentionally allowed to escape from the semiconductor device and damages or destroys surrounding components.

SUMMARY

The object of the invention is thus to provide a fast-switching semiconductor device, which in the event of a fault can absorb a high residual current and switch off a module in a timely manner without allowing unwanted plasma to escape from the semiconductor device, so that damage to the module can be reliably prevented.

A semiconductor device comprises a semiconductor body which has a first surface and a second surface opposite the first surface in a vertical direction, a gate region, and an active region arranged adjacent to the gate region in the horizontal direction. A first emitter of a first conductivity type, a first base of a second conductivity type, and a second base of the first conductivity type are arranged consecutively between the second surface and the first surface in a vertical direction. The semiconductor device further comprises a front-facing emitter of the second conductivity type arranged in the active region, which extends in the vertical direction from the first surface into the second base, and a plurality of short-circuit regions of the first conductivity type extending from the first surface through the front-facing emitter to the second base, the active region having a first edge region adjoining the gate region in the horizontal direction, a failure region adjacent to the first edge region in the horizontal direction, and a second edge region adjoining the failure region in the horizontal direction, and an average density of the short-circuit regions arranged in the failure region is lower than an average density of the short-circuit regions arranged in each of the first edge region and the second edge region.

BRIEF DESCRIPTION OF THE DRAWINGS

The invention is described in greater detail in the following based on examples and by reference to the drawings. In this case, identical reference signs refer to identical elements. The representation in the figures is not to scale.

DETAILED DESCRIPTION

The following detailed description illustrates how the invention can be realized by means of specific examples. It is understood that the features of the various examples described herein may be combined, unless otherwise mentioned. If certain elements are referred to as "first element", "second element", . . . or the like, the designation "first", "second", . . . is used only to distinguish different elements from each other. A sequence or enumeration is not implied with this designation. This means that, for example, a "second element" can exist even if there is no "first element" present.

Figure 1:
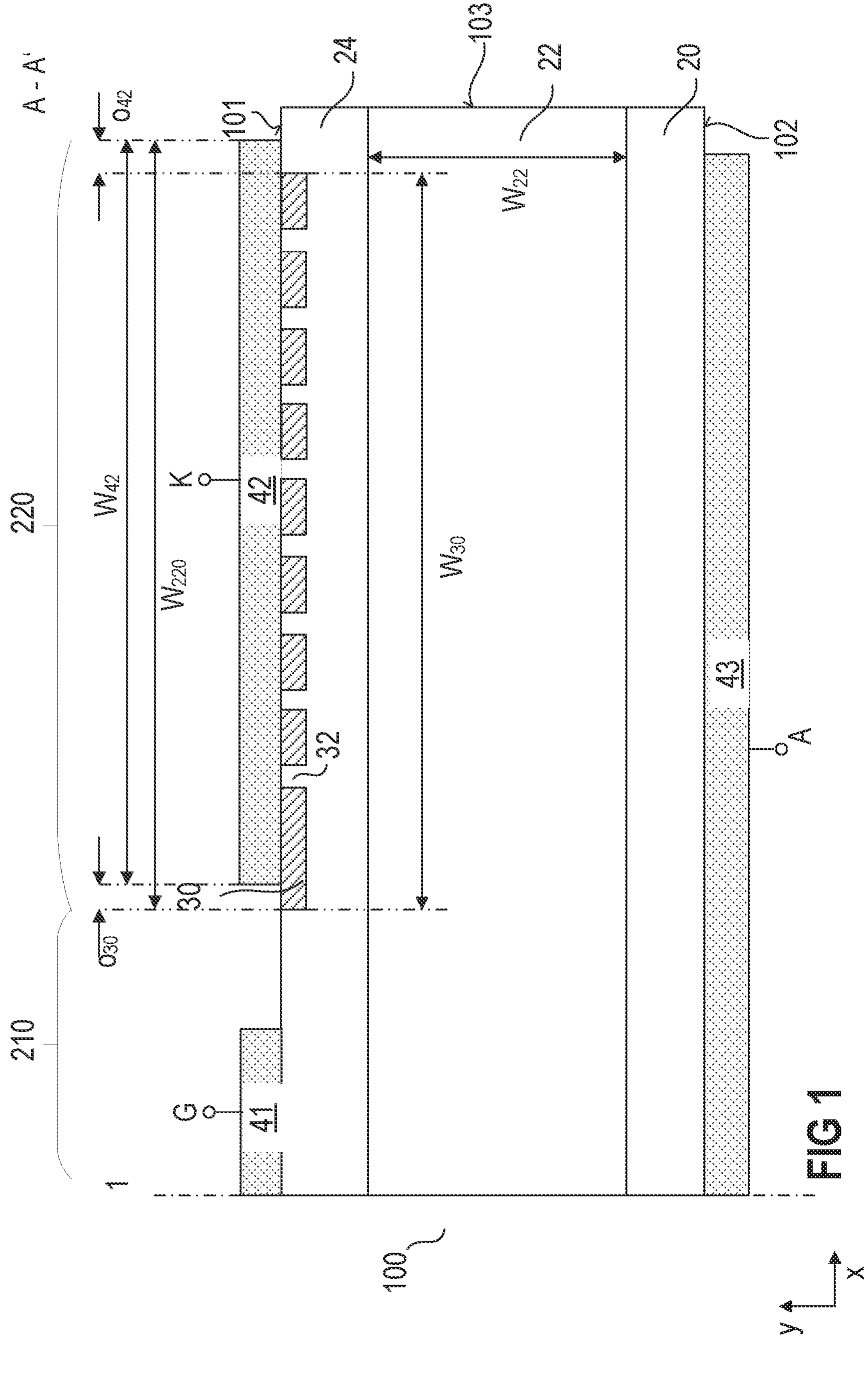
FIG. 1 schematically shows a cross-section through a semiconductor device.

FIG. 1 schematically shows a cross-section through a semiconductor device. The semiconductor device comprises a semiconductor body 100, wherein the semiconductor body 100 has a first surface 101 and a second surface 102 opposite the first surface 101 in the vertical direction y. The semiconductor body 100 may consist of a conventional semiconductor material such as silicon (Si), silicon carbide (SiC), gallium nitride (GaN), gallium arsenide (GaAs), or the like.

A thyristor-like structure is formed in the semiconductor body 100, although FIG. 1 only shows a portion of the thyristor-like structure. In particular, a p-doped emitter 20 (first emitter of a first conductivity type), an n-doped base 22 (first base of a second conductivity type), and a p-doped base 24 (second base of the first conductivity type) are arranged consecutively in the vertical direction y between the second surface 102 and the first surface 101. That is to say, the p-doped emitter 20 extends in the vertical direction y from the second surface 102 into the semiconductor body 100, and the p-doped base 24 extends from the first surface 101 in the direction of the p-doped emitter 20 into the semiconductor body 100. The n-doped base 22 is arranged in the vertical direction y between the p-doped emitter 20 and the p-doped base 24 and separates them from each other.

Instead of a p-doped emitter 20, an n-doped base 22 and a p-doped base (so-called npnp structure), an n-doped emitter 20, a p-doped base and an n-doped base 24 could also be arranged consecutively in the vertical direction y between the second surface 102 and the first surface 101 (so-called pnpn structure). The principles described below based on an npnp structure can easily be applied to a pnpn structure.

The semiconductor body 100 has a gate region 210, and an active region 220 arranged adjacent to the gate region 210 in the horizontal direction x. An n-doped front-facing emitter 30 is arranged in the active region 220, extending in the vertical direction y from the first surface 101 into the p-doped base 24. In the case of a pnpn structure, a p-doped front-facing emitter 30 is arranged in the active region 220, which extends in the vertical direction y from the first surface 101 into the n-doped base 24. However, the n-doped front-side emitter 30 extends only partially into the p-doped base 24, so that a layer of the p-doped base 24 is arranged between the n-doped front-facing emitter 30 and the n-doped base 22, and the n-doped front-facing emitter 30 is separated from the n-doped base 22 by this layer of the p-doped base 24. The n-doped front-facing emitter 30 has a width $W_{30}$ in the horizontal direction x. This width $W_{30}$ is often referred to as the emitter width.

A plurality of short-circuit regions 32 doped in a complementary manner to the n-doped front-facing emitter 30 extends from the first surface 101 through the n-doped front-facing emitter 30 to the p-doped base 24. By means of these short-circuit regions 32, the p-doped base 24 can be directly electrically connected to a cathode electrode 42 arranged on the first surface 101. The cathode electrode 42 can form a cathode terminal K or be electrically connected to a cathode terminal K. The cathode electrode 42 is arranged on the first surface 101 substantially in regions above the front-facing emitter 30. That is to say, the cathode electrode 42 is arranged in the active region 220, but not in the gate region 210.

The cathode electrode 42 has a width $W_{42}$ in the horizontal direction x. In the horizontal direction x, the front-facing emitter 30 extends further to the gate region 210 than the cathode electrode 42. This means that the front-facing emitter 30 here is not completely covered by the cathode electrode 42. The region of the front-facing emitter 30 which is not covered by the cathode electrode 42 (distance $o_{30}$ between a first edge of the front-facing emitter 30 and a first edge of the cathode electrode 42), can have a width om in the horizontal direction x of, for example, 0.1 to 0.5 mm. While in the direction of the gate region 210, the front-facing emitter 30 protrudes beyond the cathode electrode 42, the cathode electrode 42 protrudes on its side facing away from the gate region 210 beyond the front-side emitter 30. For example, a distance $o_{42}$ between a second edge of the cathode electrode 42 and a second edge of the front-facing emitter 30 in the horizontal direction x can be up to 1 cm. For example, the distance $o_{42}$ between a second edge of the cathode electrode 42 and a second edge of the front-facing emitter 30 may be greater than the distance $o_{30}$ between the first edge of the front-facing emitter 30 and the first edge of the cathode electrode 42. In this case, the first edge of the cathode electrode 42 is an edge facing the gate region 210, and the second edge of the cathode electrode 42 is an edge facing away from the gate region 210. The first edge of the front-facing emitter 30 is an edge facing the gate region 210, and the second edge of the front-facing emitter 30 is a side facing away from the gate region 210.

In the gate region 210, a gate electrode 41 is arranged on the first surface 101. The gate electrode 41 can form a gate terminal G or be electrically connected to a gate terminal G. The gate electrode 41 is spaced apart from the cathode electrode 42 in the horizontal direction x. This means that there is no direct electrical connection between the gate electrode 41 and the cathode electrode 42.

An anode electrode 43 is arranged on the second surface 102 of the semiconductor body 100. The anode electrode 43 can completely or almost completely cover the second surface 102. That is to say, the anode electrode 43 is arranged both in the gate region 210 and in the active region 220. The anode electrode 43 can form an anode terminal A or be connected to an anode terminal A.

The gate electrode 41 can form an ignition structure of the thyristor-like component. The n-doped front-facing emitter 30, the p-doped base 24, the n-doped base 22 and the p-doped emitter 20 form a self-blocking npnp structure. This means that in the normal state (gate current=zero) the semiconductor device blocks in both possible polarities. An electrically conductive, low-resistance connection between the cathode electrode 42 and the anode electrode 43 can be produced by a triggering or activation signal (e.g. positive gate current greater than zero from the gate electrode 41 to the cathode electrode 42) applied to the gate electrode 41, wherein the anode electrode 43 is connected to a first potential, the cathode electrode 42 is connected to a second potential, and the first potential is positive with respect to the second potential (positive voltage between anode electrode 43 and cathode electrode 42). When the semiconductor device is switched on (triggered), a current plasma is formed which propagates from a side of the n-doped front-facing emitter 210 facing the gate region 30 over the entire active region 220 until the entire active region 220 carries the current and a high load current flows between the cathode electrode 42 and the anode electrode 43. An applied forward voltage assumes its lowest value in this conducting state of the semiconductor device. Only when the current flowing through the semiconductor device drops back to zero does the semiconductor device switch back to the blocking state.

The reverse or blocking voltage of such a thyristor-like component is given by the minimum thickness $W_{22}$ and the specific resistance p of the n-doped base 22. The transmission losses (conduction losses) and the maximum permissible surge current are determined by the minimum surface area of the n-doped front-facing emitter 30, among other things. However, since the thyristor-like semiconductor device described absorbs a high residual current in the event of a fault and is thereby destroyed (melted), transmission losses do not play a significant role, since unlike the case of conventional thyristors a large number of switching operations is not carried out.

Figure 2:
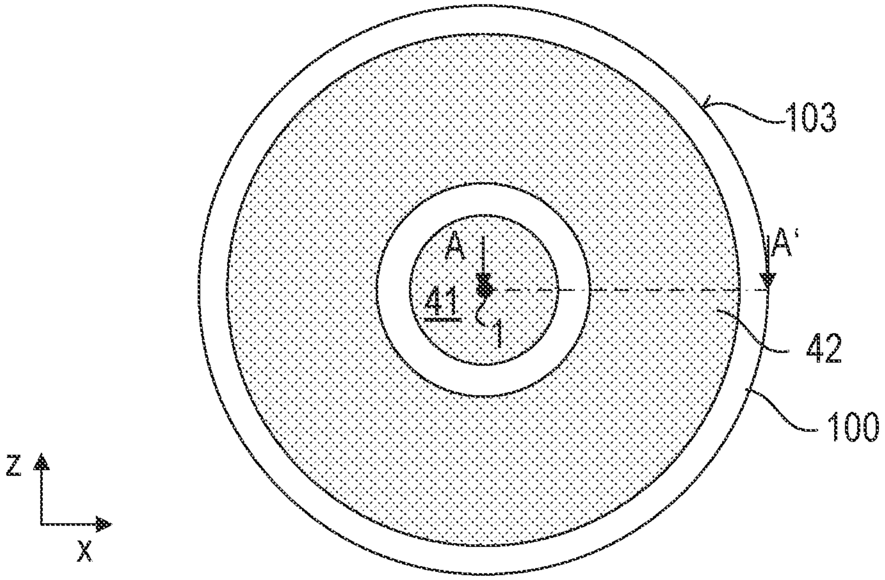
FIG. 2 shows an example of a plan view of the semiconductor device from FIG. 1.

Now referring to FIG. 2, a schematic plan view of a semiconductor device according to the example of FIG. 1 is shown. The semiconductor body 100 has a round cross-sectional surface. Instead of a round cross-sectional surface, however, other shapes such as angular shapes (e.g. square or rectangular) are also entirely possible. In the example shown in FIG. 2, the gate region 210 is arranged in a central region of the semiconductor body 100 and is surrounded in the radial direction by the active region 220. That is, the gate electrode 41 is arranged in a central region of the semiconductor body 100, and the cathode electrode 42 forms a ring surrounding the gate electrode 41 in the horizontal direction. In the plan view in FIG. 2, only the gate electrode 41 and the cathode electrode 42 are visible. The regions below them are not explicitly shown for the sake of clarity.

Figure 3:
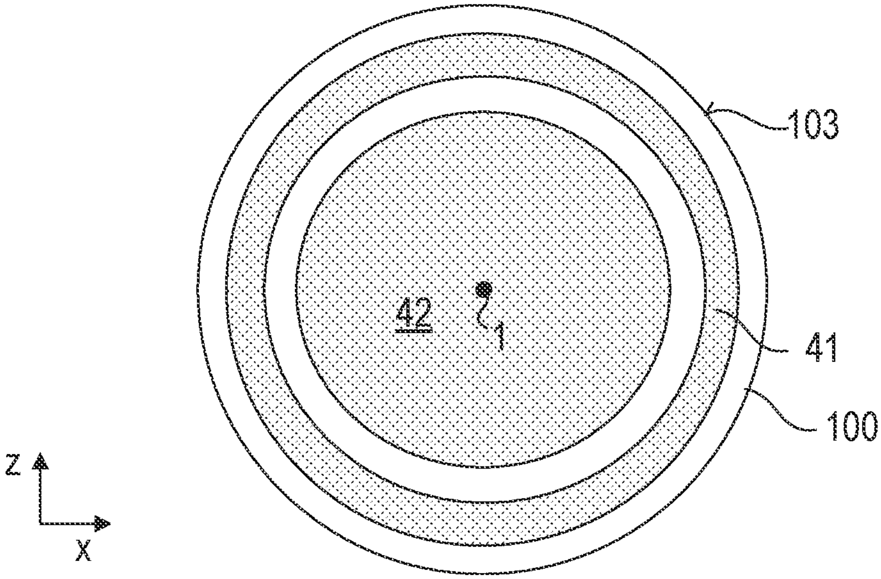
FIG. 3 shows an example of a plan view of a semiconductor device according to another example.

However, the option to arrange the gate region 210 in a central region of the semiconductor body 100 is only one example. As schematically illustrated in FIG. 3, it is also possible to arrange the active region 220 in a central region of the semiconductor body 100. In this example, the active region 220 (cathode electrode 42) is surrounded horizontally by the gate region 210 (gate electrode 41). However, the basic principle is the same as that described above. In both examples, the semiconductor device is rotationally symmetrical about a central axis 1, wherein FIG. 1 shows a cross-section of the semiconductor device from FIG. 2 along a sectional plane A-A'. For example, the diameter of a round semiconductor body 100 may be between 15 mm and 150 mm Larger diameters of up to 200 mm or more are also quite possible.

One or more of the thyristor-like components described may be connected to a power semiconductor module, such as an IGBT (Insulated Gate Bipolar Transistor) module. In the event of a short circuit, the thyristor-like component can pass any high residual current that occurs. The residual current is provided at the cathode electrode 42 of the semiconductor device, so that the thyristor-like component triggers (is switched on) in the event of a residual current. The semiconductor device is often melted and destroyed, in particular at very high residual currents. The semiconductor device may be arranged in a ceramic capsule, for example. On melting of the semiconductor device, a plasma is formed due to the cathode contact tearing off, which can lead to faults or even failures of one or more components of the power semiconductor module connected to the thyristor-like device if this plasma escapes from the semiconductor device, in particular from the ceramic capsule, and damages or destroys surrounding components.

Figure 4:
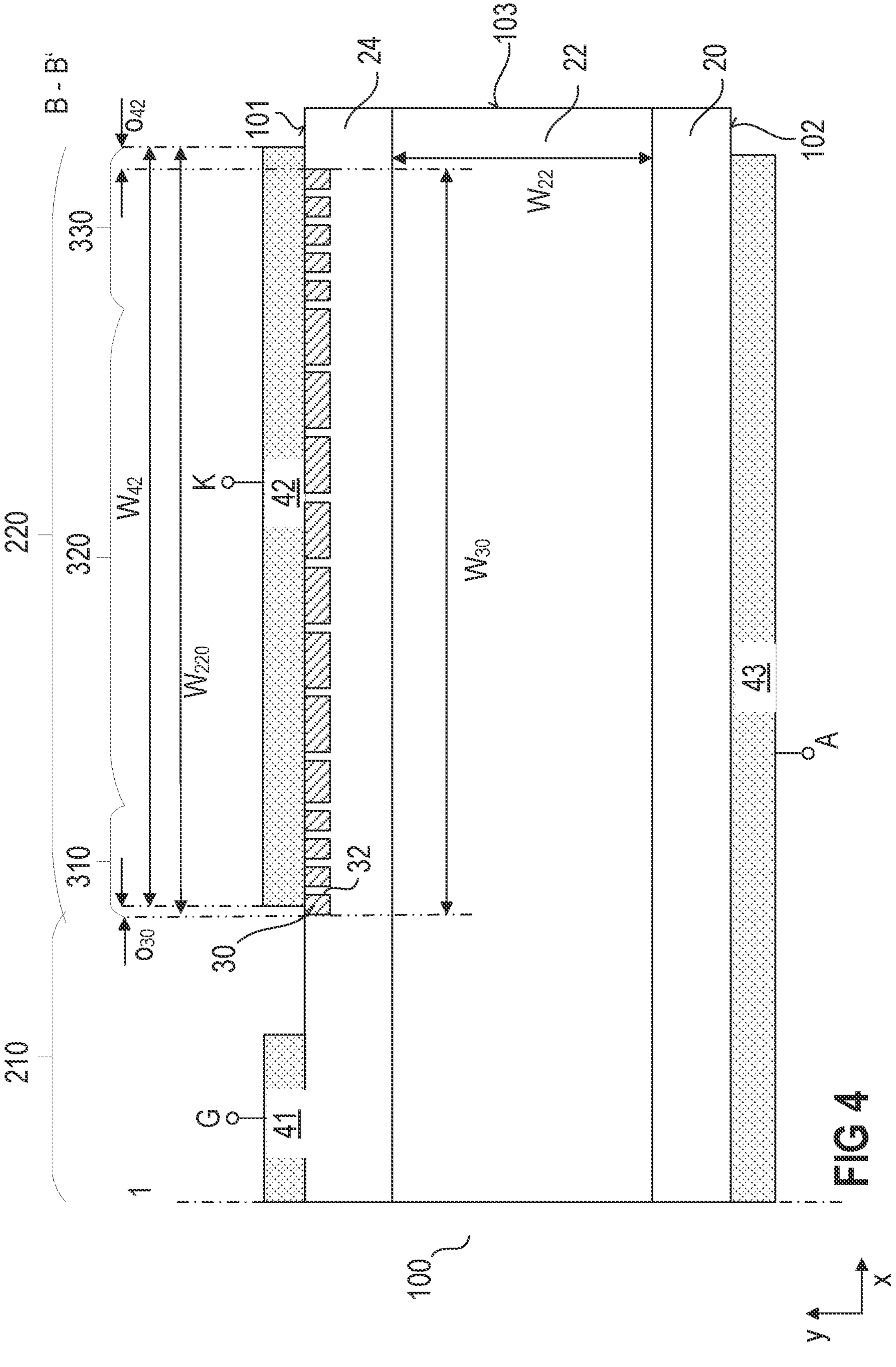
FIG. 4 schematically shows a cross-section through a semiconductor device according to an example.

In order to prevent an unwanted escape of plasma from the semiconductor device, in particular from the ceramic capsule, the semiconductor device shown in the example shown in FIG. 4 has in its active region 220 a first edge region 310 adjacent to the gate region 210 in the horizontal direction x, a failure region 320 adjacent to the first edge region 310 in the horizontal direction x, and a second edge region 330 adjacent to the failure region 320 in the horizontal direction x. The failure region 320 is arranged between the first edge region 310 and the second edge region 330. As explained above in relation to FIG. 1, the semiconductor device has an n-doped front-facing emitter 30 arranged in the active region 220, which extends in the vertical direction y from the first surface 101 into the p-doped base 24, wherein a plurality of short-circuit regions 32 doped in a complementary manner to the front-facing emitter 30 extends from the first surface 101 through the front-facing emitter 30 to the p-doped base 24.

In the semiconductor device shown in FIG. 1, the plurality of short-circuit regions 32 is evenly distributed over the entire n-doped front-facing emitter 30. That is to say, an average density of the short-circuit regions 32 is the same over the entire area of the n-doped front-facing emitter 30. That is, the cross-sectional area ratio is the same over the entire area of the n-doped front-facing emitter 30, the cross-sectional area ratio being equal to the ratio between the sum of the individual cross-sectional areas of all short-circuit regions 32 in a certain portion of the n-doped front-facing emitter 30 and the cross-sectional area of the corresponding portion of the n-doped front-facing emitter 30.

In contrast, in the semiconductor device shown in FIG. 4, an average density of the short-circuit regions 32 arranged in the failure region 320 is lower than an average density of the short-circuit regions 32 arranged in each of the first edge region 310 and the second edge region 330. That is, the cross-sectional area ratio in the first edge region 310 and the second edge region 330 is greater than the cross-sectional area ratio in the failure region 320 in each case. The average density of the short-circuit regions 32 (cross-sectional area ratio) affects the load current in the respective region and thus the propagation speed of the resulting conductor plasma. In regions with high average density of the short-circuit regions 32 (large cross-sectional area ratio), the propagation speed of the conductor plasma is lower (lower current density of the anode-cathode current) than in regions with low average density (small cross-sectional area ratio) of the short-circuit regions 32 (higher current density of the anode-cathode current).

Since the failure region 320 has a lower average density of the short-circuit regions 32 compared to the first edge region 310 and the second edge region 330, the current density of the anode-cathode current there is comparatively high and the propagation speed of the conductor plasma is correspondingly higher than in the first edge region 310 and the second edge region 330. The semiconductor device thus fails in the failure region 320 first when a current pulse occurs at the gate electrode 41. The conductor plasma thus propagates from the failure region 320 over the entire active region 220. By means of the first edge region 310 which is arranged between the failure region 320 and the gate region 210, an increased dv/dt resistance of the semiconductor device is achieved. In order to protect the gate region 210 effectively, the first edge region 310 arranged between the failure region 320 and the gate region 210 can have a width, for example, of between 0.8 mm and 1.2 mm, e.g. 1 mm By means of the second edge region 330 the current density is reduced in comparison to the failure region 320 in the direction of a vertical outer surface 103 of the semiconductor body 100. The second edge region 330 can have the same width as the first edge region 310. For effective protection against escape of plasma from the semiconductor device, however, the width of the second edge region 330 can also be chosen larger than the width of the first edge region 310, e.g. twice as wide. The width of the first edge region 310 and the second wheel region 330 can be chosen, for example, according to the diameter of a round semiconductor body 100 and the size of the currents that might occur in the event of a fault.

Figure 5:
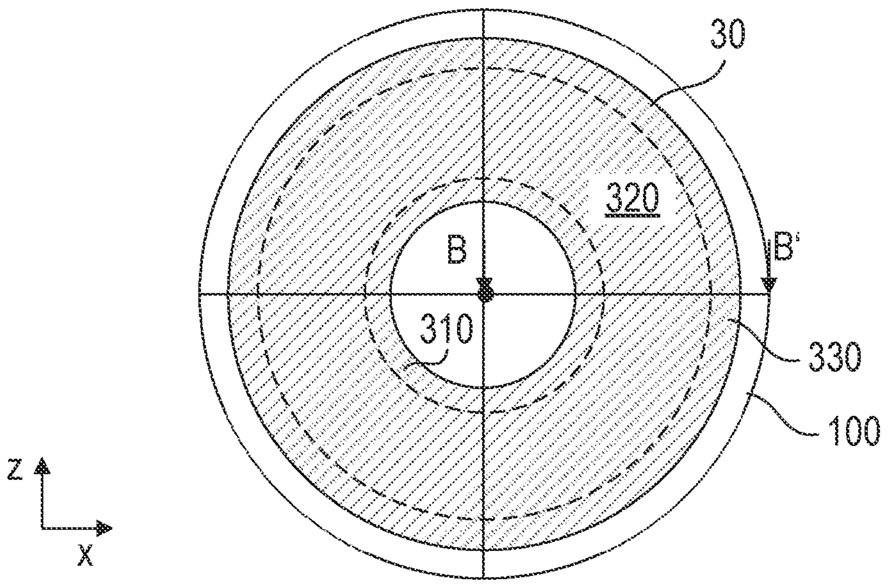
FIG. 5 schematically shows a plan view of the emitter structure of the semiconductor device from FIG. 4.

FIG. 5 shows an example of a plan view of a semiconductor device of this type. In the view shown in FIG. 5, the gate electrode 41 and the cathode electrode 42 have been omitted. FIG. 5 thus shows a plan view of the first surface 101, which makes the n-doped front-facing emitter 30 extending from the first surface 101 into the semiconductor body 100 visible. The plurality of short-circuit regions 32 is not explicitly shown in the view shown in FIG. 5. FIG. 4 shows a cross-section of the semiconductor device from FIG. 5 along a sectional plane B-B'.

According to one example, each of the plurality of short-circuit regions 32 is columnar shaped. That is, each of the short-circuit regions 32 essentially has the shape of a column, which extends in the vertical direction y from the first surface 101 through the n-doped front-facing emitter 30.

Each of the short-circuit regions 32 may, for example, have a round, oval or polygonal cross-section in the horizontal direction.

Figure 6:
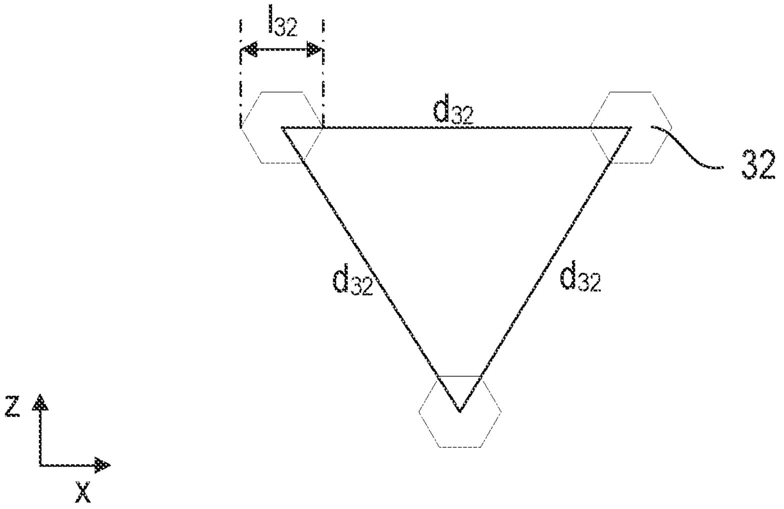
FIG. 6 schematically shows an arrangement of short-circuit regions according to an example.

FIG. 6 shows, in a plan view, by way of example only three of a plurality of column-shaped short-circuit regions 32, wherein the short-circuit regions 32 have a hexagonal cross-section. Each of the short-circuit regions 32 of the plurality of short-circuit regions 32 are arranged at a different corner of an equilateral triangle. This means that the distance $d_{32}$ between two directly adjacent short-circuit regions 32 is always identical. A maximum extension $l_{32}$ of each of the plurality of short-circuit regions 32 in the horizontal direction x can be, for example, 200 μm. The shape and size (cross-sectional area) of each of the plurality of short-circuit regions 32 can be identical, regardless of whether a short-circuit region 32 is arranged in the failure region 320 or in the first or second edge region 310, 330. However, in the first edge region 310 and the second edge region 330, the distance $d_{32}$ between two directly adjacent short-circuit regions 32 can be between 200 μm and 800 μm, while in the failure region 320, the distance $d_{32}$ between two directly adjacent short-circuit regions 32 is, for example, at least 1000 μm. As a result, the average density of the short-circuit regions 32 in each of the regions 310, 320, 330 can be adjusted accordingly by selecting a suitable distance $d_{32}$ between two directly adjacent short-circuit regions 32.

Figure 7:
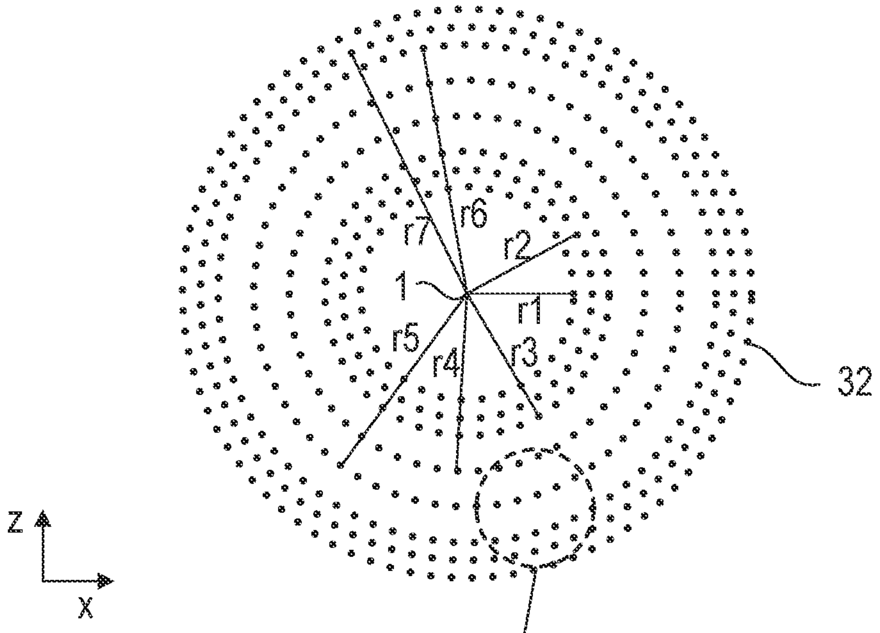
FIG. 7 schematically shows an arrangement of short-circuit regions according to another example.

However, the arrangement of the short-circuit regions 32 at the corners of equilateral triangles, as illustrated in FIG. 6 for three short-circuit regions 32, is only one example. Alternatively, it is also possible to arrange the short-circuit points 32 in other regular or irregular patterns. A further possible example is shown schematically in FIG. 7. FIG. 7 shows a plan view of a plurality of short-circuit regions 32. Other elements of the semiconductor device are not shown in this view for the sake of simplicity. In the example shown in FIG. 7, the short-circuit points 32 are each arranged along a plurality of concentric circles. Each of the circles has a different radius about the central axis 1. A different average density of the short-circuit points 32 can be achieved by varying the difference between the radii of two adjacent circles. For example, a first circle with radius r1, a second circle with radius r2, and a third circle with radius r3 may be arranged in the first edge region 310. A fourth circle with the radius r4 and a fifth circle with the radius r5 may be arranged in the failure region 320, and a sixth circle with the radius r6, a seventh circle with the radius r7 (as well as further circle(s)) may be arranged in the second edge region 330. The following relations apply:

$$(r2-r1)=(r3-r2)=(r7-r6)=x$$

and $$(r4-r3)=(r5-r4)=(r6-r5)=y$$

where x<y. In this case, x can be selected such that no unintentional triggering of the semiconductor device takes place in the first edge region 310 or the second edge region 330 due to a high dv/dt. This means that an upper limit for x can be defined based on a maximum possible dv/dt. However, this upper limit depends on different factors and may vary for different semiconductor devices.

According to this principle, one or more rings can be arranged in each of the regions 310, 320, 330. The distance $d_{325}$, $d_{327}$ between two adjacent short-circuit regions 32 within one circle can be identical for all circles. However, it is also possible, alternatively or additionally, to vary the distance between two adjacent short-circuit regions 32 accordingly in order to reduce or increase the average density of the short-circuit regions 32 in a region 310, 320, 330.

Figure 8:
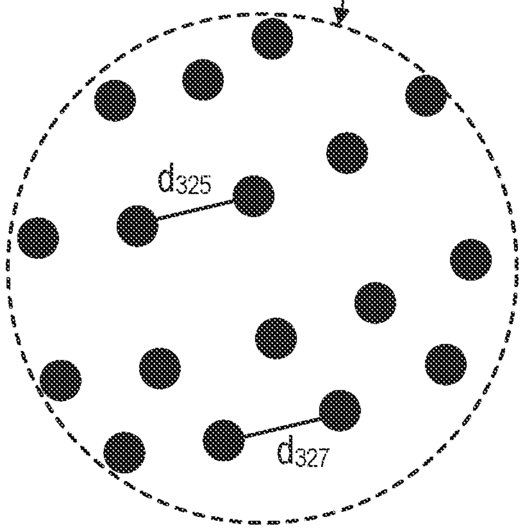
FIG. 8 schematically shows a detail of the arrangement from FIG. 7.

FIG. 8 shows an example detail from the arrangement according to FIG. 7. FIG. 8 schematically shows a portion of the short-circuit regions 32 of the fourth circle (radius r4), the fifth circle (radius r5), the sixth circle (radius r6) and the seventh circle (radius r7). As described above, the fifth circle may be arranged, for example, in the failure region 320, while the seventh circle is arranged in the second edge region 330. The distance $d_{32}$ between two directly adjacent short-circuit regions 32 in the fifth circle may be identical to the distance $d_{327}$ between two directly adjacent short-circuit regions in the seventh circle. However, it is also possible that the distance $d_{32}$ between two directly adjacent short-circuit regions 32 in the fifth circle is greater than the distance $d_{327}$ between two directly adjacent short-circuit regions in the seventh circle.

According to another example, it is also possible that:

$$(r2-r1)=(r3-r2)=(r7-r6)=x$$

and $$(r4-r3)=(r5-r4)=(r6-r5)=y$$

where x=y.

In this example, a different average density of the short-circuit regions 32 can be achieved, for example, exclusively by a different distance between two directly adjacent short-circuit regions 32 within the circles, wherein the distance between two directly adjacent short-circuit regions 32 in a circle arranged in the failure region 320 is greater than the distance between two directly adjacent short-circuit regions 32 in a circle arranged in the first edge region 310 or in the second edge region 330.

According to another example, it is also possible that the distance between two adjacent short-circuit regions 32 in one or more of the concentric circles is zero (e.g. $d_{325}=0$ and/or $d_{327}=0$). This results in one or more annular short-circuit regions 32, so that the front-facing emitter 30 is divided into individual concentric rings by the one or more annular short-circuit regions 32 (annular short-circuit regions 32 are not explicitly shown in the figures).

Column-shaped short-circuit regions 32 and annular short-circuit regions 32 can be combined in a suitable manner. For example, it is possible to arrange at least one annular short-circuit region 32 in each of the first edge region 310 and the second edge region 330. In the failure region 320, for example, exclusively column-shaped short-circuit regions 32 can be arranged. However, it is also possible to arrange one or more annular short-circuit regions 32 in the failure region 320. According to one example, a semiconductor device has exclusively annular short-circuit regions.

The width of each of the one or more annular short-circuit regions 32 in the horizontal direction x can be, for example, a maximum of 200 μm or a maximum of 500 μm. This width may be identical for all a plurality of annular short-circuit regions 32, regardless of whether the annular short-circuit region 32 is arranged in the failure region 320 or in one of the first or second edge regions 310, 330.

In the first edge region 310 and the second edge region 330, the distance between two directly adjacent annular short-circuit regions 32 can be, for example, between 200 μm and 800 μm (e.g., 200 μm<x<800 μm), while the distance between two directly adjacent short-circuit regions 32 in the failure region 320 can be, for example, at least 1000

μm (e.g. 1000 μm<y). According to one example, only a single annular short-circuit region 32 is arranged in the failure region 320.

According to one example, a cross-sectional area of the failure region 320 in the horizontal plane is between 10% and 50% of the total surface area of the semiconductor body 100. This means that the failure region 320 can be designed relatively narrow so that the region of high current density in the event of the semiconductor device triggering is relatively small. This means that the plasma can be effectively kept away both from the gate region 210 and from the vertical outer surface 103 of the semiconductor body 100 and escape of the plasma from the semiconductor device can be prevented. The first edge region 310, which is arranged adjacent to the gate region 210, with its high average density of short-circuit regions 32 increases the robustness of the semiconductor device against high voltage surges (increased dv/dt resistance of the semiconductor device). By a suitable choice of the size of the failure range 320, the minimum current at which the semiconductor device melts can be suitably adjusted. A critical current density at which melting occurs in the failure region 320 can be achieved even at a relatively low absolute current (e.g. between 1 and 2 kA/cm$^2$), depending on the design.

In addition to the reduced average density of the short-circuit regions 32 in the failure region 320, described above, the current density in the failure region 320 can also be further increased in a different way. As described above in relation to FIG. 1, a semiconductor device usually comprises a cathode electrode 42 arranged in the active region 220 on the first surface 101 and electrically connected to the n-doped front-facing emitter 30. This is usually formed by a continuous metallic disc or layer.

Figure 9:
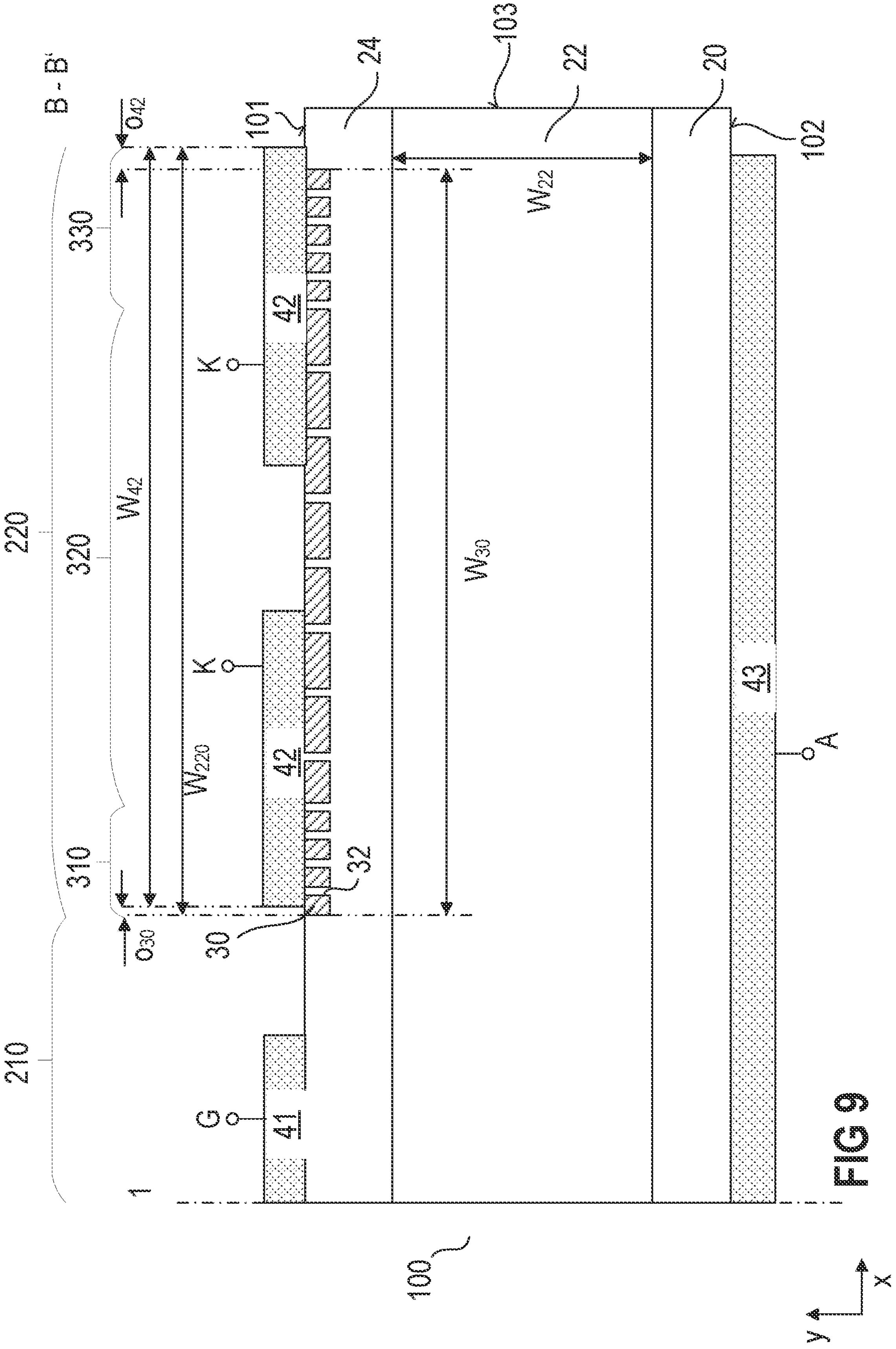
FIG. 9 schematically shows a cross-section through a semiconductor device according to another example.

Now referring to FIG. 9, the cathode electrode 42 within the failure region 320 can have at least one annular discontinuity. As shown in FIGS. 2 and 3 and as described above, in a semiconductor device with a round cross-section the cathode electrode 41 has the shape of a circle or a ring. In the case of an annular cathode electrode 42 (see e.g. FIG. 2), such an annular discontinuity results in a first annular cathode electrode portion and a second annular cathode electrode portion separated from the first. If there is more than one annular discontinuity, the number of resulting annular cathode electrode portions is correspondingly greater. In the case of a circular cathode electrode 42 (see e.g. FIG. 3) an annular discontinuity results in a circular first cathode electrode portion and an annular second cathode electrode portion separated from the first. If there is more than one annular discontinuity, this results in a circular first cathode electrode section and correspondingly more additional annular cathode electrode portions.

The cathode electrode 42 is used on the one hand for electrically contacting the n-doped front-facing emitter 30. The cathode electrode 42, however, in principle also has the additional function of conducting heat generated during the flow of a current in the semiconductor device away from the semiconductor body 100. A continuous cathode electrode 42, as shown for example in FIGS. 1 and 4, results in a very homogeneous heat dissipation since the entire surface of the n-doped front-facing emitter 30 is uniformly contacted. However, if the cathode electrode 42 is partially discontinuous as shown in FIG. 9, the regions that are directly contacted by the resulting cathode electrode portions are cooled more effectively than the regions of the semiconductor body that are located below the one or more discontinuities. The regions below the one or more discontinuities therefore heat up more strongly, which further increases the current density in these regions. By using one or more annular discontinuities of the cathode electrode 42 in the failure region 320, at least one "hot spot" can therefore be selectively generated and the failure region of the semiconductor device can be selectively adjusted.

Figure 10:
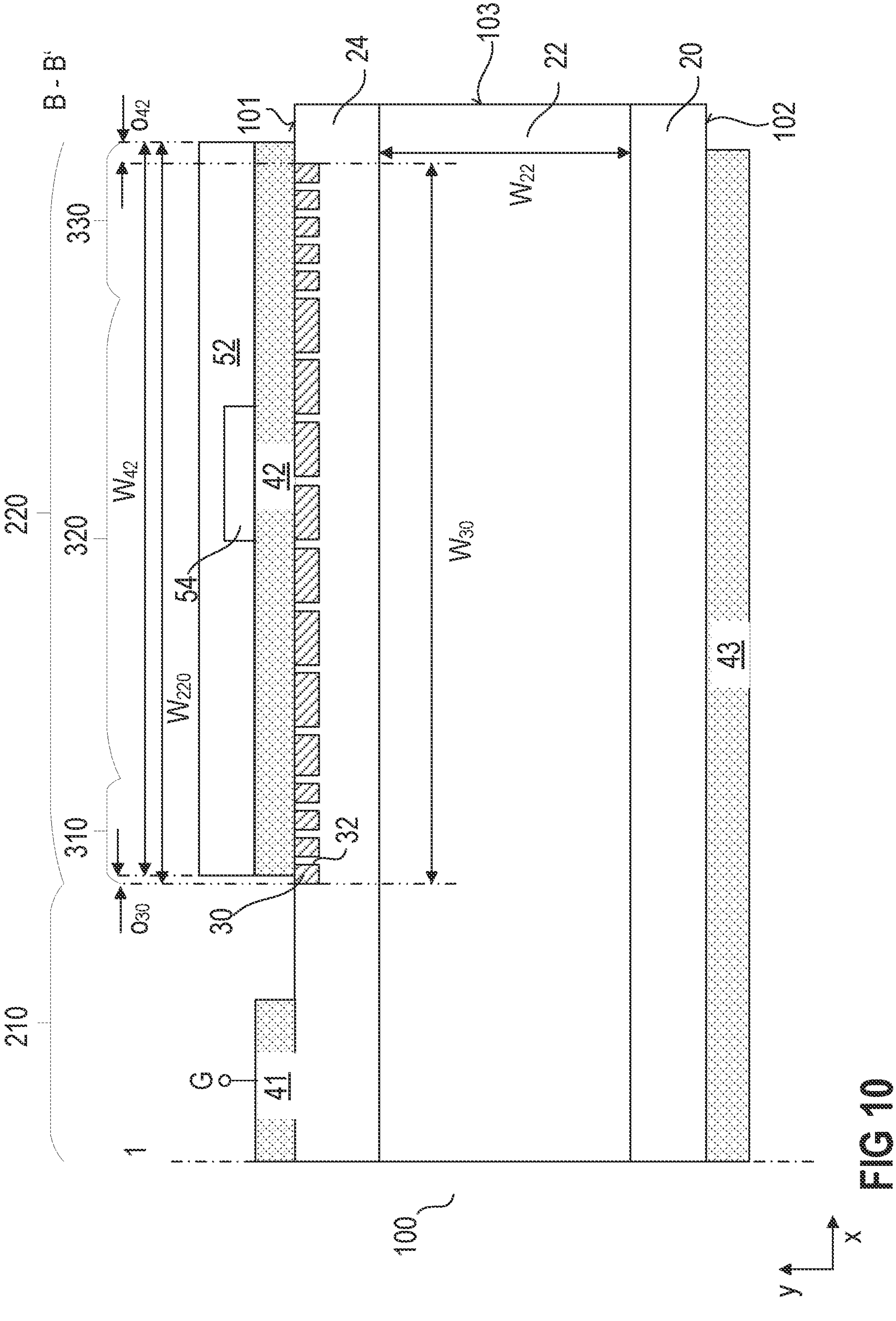
FIG. 10 schematically shows a cross-section through a semiconductor device according to another example.

However, such a "hot spot" can be generated in a different way instead of by one or more discontinuities of the cathode electrode 42. Referring to FIG. 10, the semiconductor device may also comprise a housing with a housing lid 52. For example, the entire semiconductor body 100 may be surrounded by a housing. In FIG. 10, for the sake of clarity, only a portion of the housing lid 52 is shown, instead of the entire housing. The housing lid 52 is arranged on the cathode electrode 42. For example, the cathode electrode 42 can be pressure-contacted by the housing lid 52. Heat which is conducted away from the semiconductor body 100 via the cathode electrode 42 can be further dissipated to the outside via the housing cover 52. Instead of providing one or more discontinuities in the cathode electrode 42, the housing lid 52 may have a notch or recess 54 within the failure region 320, so that the contact between the housing lid 52 and the cathode electrode 42 in the failure region 320 is at least partially discontinuous. The effect is the same as described in relation to FIG. 9. By means of the notch 54 in the housing lid 52, heat is deliberately less effectively dissipated in certain regions, which again leads to a local increase in the current density in the semiconductor body 100.

Figure 11:
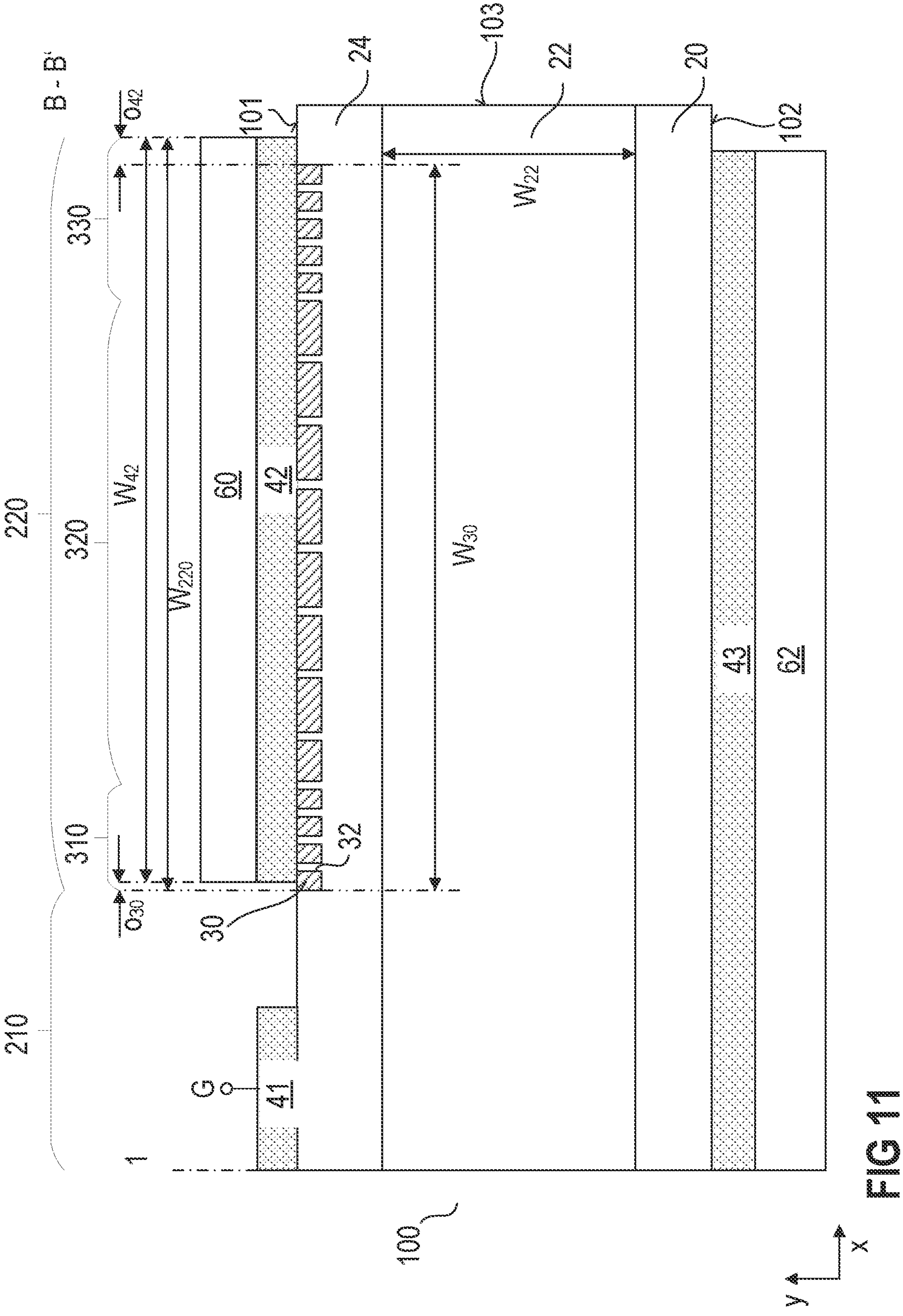
FIG. 11 schematically shows a cross-section through a semiconductor device according to another example.

Referring now to FIG. 11, the semiconductor device may have a first contact disk 60 which contacts the cathode electrode 42 in an electrically conductive manner, and a second contact disk 62 which electrically contacts the anode electrode 43. The first and the second contact disk 60, 62 can be arranged, for example, together with the semiconductor body 100 within a housing. The cathode electrode 42 and the anode electrode 43 may contain, for example, aluminum or consist of aluminum. The housing lid 52 can comprise, for example, copper or be made of copper. The first and second contact disks 60, 62 are usually composed of molybdenum. The thermal expansion coefficient of molybdenum lies between the thermal expansion coefficient of copper and silicon, of which the semiconductor body 100 is normally composed. Therefore, molybdenum contact discs 60, 62 are able to reduce high thermo-mechanical forces which arise under severe load-changing stress on the semiconductor body 100.

However, a thyristor-like semiconductor device, which in the event of a fault absorbs any high residual current that occurs and is thereby destroyed (melted), is not exposed to any load-changing stress, so that no reduction in the thermo-mechanical forces by means of the contact disks 60, 62 is necessary. Instead of molybdenum, the first and/or the second contact disks 60, 62 may therefore consist of other materials. For example, the first contact disk 60 and/or the second contact disk 62 can each have or comprise a copper alloy, an aluminum alloy, carbon, or a carbon composite material. The first contact disk 60 may comprise the same material or a different material than the second contact disk 62. For example, the first contact disk 60 can be carbon (e.g. graphite), while the second contact disk 62 comprises an aluminum alloy or a copper alloy. However, it would also be possible for the first contact disk 60 to comprise one of a copper alloy, an aluminum alloy, carbon, or a carbon composite material, while the second contact disk 62 is a conventional molybdenum contact disk. Any other combinations are possible in principle, but according to one embodiment at least one of the contact disks 60, 62 (usually the first contact disk 60) consists of a material other than molybdenum.

The melting point of the materials described (copper alloy, aluminum alloy, carbon) can be adjusted to a specific value, whereby the melting process on triggering the semiconductor device is optimized in such a way that a short circuit with the lowest possible resistance is formed between the cathode terminal K and the anode terminal A. A contact disk 60, 62 made of a copper alloy or an aluminum alloy can absorb a large amount of energy during the melting process and optimally alloy with the material of the semiconductor body 100 (e.g. silicon). By means of a contact disk 62 made of carbon or a carbon composite material, arcing (formation of plasma) can even be completely suppressed. Thus, plasma formation can be reduced or even prevented in all regions of the semiconductor body 100, and the risk of unwanted escape of plasma from the component can be reduced.

Alternatively or in addition, it is also possible to design the component for very high reverse voltages. In general, the reverse voltage of the component increases with increasing thickness of the semiconductor body 100 in the vertical direction y. The switching losses and transmission losses also increase with the thickness of the semiconductor body 100. However, since a thyristor-like semiconductor device which absorbs a high residual current and is thereby destroyed (melted) in the event of a fault does not perform any switching operations, such increased switching and forward losses are not significant. Therefore, it is possible to increase the thickness of the semiconductor body 100 in the vertical direction and thereby increase the reverse voltage of the component. According to one example, the semiconductor body 100 has a thickness of at least 500 μm and not more than 1000 μm in the vertical direction y, or at least 700 μm and not more than 1000 μm. This results, for example, in a reverse voltage of at least 2.2 kV up to 8 kV. For example, an even greater thickness of the semiconductor body 100 of 1.5 mm can result in a reverse voltage of around 9 kV. Any further increase in the thickness of the semiconductor body 100 essentially leads to an even greater reverse voltage. Reverse voltages of up to well over 9 kV are possible in principle by further increasing the thickness of the semiconductor body 100. The thickness of the semiconductor body 100 in this case corresponds to a distance between the first surface 101 and the second surface 102.

Due to the greater thickness of the semiconductor body 100, the blocking capacity at the edge of the semiconductor body 100 toward the vertical outer surface 103 can be improved in particular. The edge regions of the semiconductor body 100 toward the vertical outer surface 103 are significantly more robust against possible overvoltages for greater thicknesses of the semiconductor body 100. This significantly reduces the likelihood of a component failure in the peripheral regions compared to thinner semiconductor bodies. This measure can therefore be used additionally to ensure that any component failure essentially occurs in the failure region 320. This can further reduce the risk of plasma escaping from the component and possibly even from the housing surrounding the component. However, the thickness of the semiconductor body 100 can be selected so that it does not exceed a certain maximum value (e.g. 1000 μm). If a certain thickness is exceeded, however, the behavior of the semiconductor device may become difficult to control.

Terms such as “first”, “second”, and the like, are used to describe various elements, regions, sections, etc. and are also not intended to be limiting. Like terms refer to like elements throughout the description.

As used herein, the terms “having”, “containing”, “including”, “comprising” and the like are open ended terms that indicate the presence of stated elements or features, but do not preclude additional elements or features. The articles “a”, “an” and “the” are intended to include the plural as well as the singular, unless the context clearly indicates otherwise.

The expression “and/or” should be interpreted to include all possible conjunctive and disjunctive combinations, unless expressly noted otherwise. For example, the expression “A and/or B” should be interpreted to mean only A, only B, or both A and B. The expression “at least one of” should be interpreted in the same manner as “and/or”, unless expressly noted otherwise. For example, the expression “at least one of A and B” should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:

a semiconductor body having a first surface, a second surface opposite the first surface in a vertical direction, a gate region, and an active region arranged adjacent to the gate region in a horizontal direction;

a first emitter of a first conductivity type, a first base of a second conductivity type, and a second base of the first conductivity type which are arranged consecutively between the second surface and the first surface in the vertical direction;

a front-facing emitter of the second conductivity type arranged in the active region and extending from the first surface to the second base in the vertical direction; and a plurality of short-circuit regions of the first conductivity type extending from the first surface through the front-facing emitter to the second base, wherein the active region has a first edge region adjacent to the gate region in the horizontal direction, a failure region adjacent to the first edge region in the horizontal direction, and a second edge region adjacent to the failure region in the horizontal direction, wherein an average density of the short-circuit regions arranged in the failure region is lower than an average density of the short-circuit regions arranged in each of the first edge region and the second edge region.

2. The semiconductor device of claim 1, wherein a cross-sectional area of the failure region in the horizontal plane is between 10% and 50% of a total surface area of the semiconductor body.

3. The semiconductor device of claim 1, wherein each of the short-circuit regions is columnar shaped and has a round, oval or polygonal cross-section in the horizontal direction.

4. The semiconductor device of claim 3, wherein an extension of each of the short-circuit regions in the horizontal direction is a maximum of 200 μm.

5. The semiconductor device of claim 3, wherein in the first edge region and the second edge region, the distance between two directly adjacent short-circuit regions is between 200 μm and 800 μm, and wherein in the failure region, the distance between two directly adjacent short-circuit regions is at least 1000 μm.

6. The semiconductor device of claim 3, wherein each of the short-circuit regions has an identical cross-sectional area in the horizontal plane.

7. The semiconductor device of claim 1, wherein each of the short-circuit regions has an annular shape, such that the front-facing emitter is divided by the short-circuit regions into individual, concentric rings.

8. The semiconductor device of claim 7, wherein a width of each of the short-circuit regions in the horizontal direction is a maximum of 500 μm.

9. The semiconductor device of claim 7, wherein in the first edge region and the second edge region, the distance between two directly adjacent short-circuit regions is between 200 μm and 800 μm, and wherein in the failure region, the distance between two directly adjacent short-circuit regions is at least 1000 μm.

10. The semiconductor device of claim 1, wherein at least one of the short-circuit regions has an annular shape, and wherein at least one of the short-circuit regions is columnar shaped and has a round, oval or polygonal cross-section in the horizontal direction.

11. The semiconductor device of claim 10, wherein at least one of the short-circuit regions arranged in the second edge region has an annular shape.

12. The semiconductor device of claim 1, further comprising:

a gate electrode arranged in the gate region on the first surface and electrically connected to the second base;

a cathode electrode arranged in the active region on the first surface and electrically connected to the front-facing emitter; and an anode electrode arranged on the second surface and electrically connected to the first emitter.

13. The semiconductor device of claim 12, wherein the cathode electrode has at least one annular discontinuity within the failure region.

14. The semiconductor device of claim 12, further comprising:

a housing with a housing lid, wherein the housing lid contacts the cathode electrode, wherein the housing lid has a notch within the failure region, such that the contact between the housing lid and the cathode electrode in the failure region is at least partially discontinuous.

15. The semiconductor device of claim 12, further comprising:

a first contact disk in electrical contact with the cathode electrode; and a second contact disk in electrical contact with the anode electrode.

16. The semiconductor device of claim 15, wherein the first contact disk and/or the second contact disk each have or comprise a copper alloy, an aluminum alloy, or carbon.

17. The semiconductor device of claim 1, wherein a width of the second edge region is larger than a width of the first edge region.

18. The semiconductor device of claim 17, wherein the second edge region is twice as wide as the first edge region.

19. A semiconductor device, comprising:

a semiconductor body having a first surface, a second surface opposite the first surface in a vertical direction, a gate region, and an active region arranged adjacent to the gate region in a horizontal direction;

a first emitter of a first conductivity type, a first base of a second conductivity type, and a second base of the first conductivity type which are arranged consecutively between the second surface and the first surface in the vertical direction;

a front-facing emitter of the second conductivity type arranged in the active region and extending from the first surface to the second base in the vertical direction; and a plurality of short-circuit regions of the first conductivity type extending from the first surface through the front-facing emitter to the second base, wherein the active region has a first edge region adjacent to the gate region in the horizontal direction, a failure region adjacent to the first edge region in the horizontal direction, and a second edge region adjacent to the failure region in the horizontal direction, wherein an average density of the short-circuit regions arranged in the failure region is lower than an average density of the short-circuit regions arranged in each of the first edge region and the second edge region, wherein each of the short-circuit regions of the plurality of short-circuit regions is arranged at a different corner of an equilateral triangle.

20. A semiconductor device, comprising:

a semiconductor body having a first surface, a second surface opposite the first surface in a vertical direction, a gate region, and an active region arranged adjacent to the gate region in a horizontal direction;

a first emitter of a first conductivity type, a first base of a second conductivity type, and a second base of the first conductivity type which are arranged consecutively between the second surface and the first surface in the vertical direction;

a front-facing emitter of the second conductivity type arranged in the active region and extending from the first surface to the second base in the vertical direction; and a plurality of short-circuit regions of the first conductivity type extending from the first surface through the front-facing emitter to the second base, wherein the active region has a first edge region adjacent to the gate region in the horizontal direction, a failure region adjacent to the first edge region in the horizontal direction, and a second edge region adjacent to the failure region in the horizontal direction, wherein an average density of the short-circuit regions arranged in the failure region is lower than an average density of the short-circuit regions arranged in each of the first edge region and the second edge region, wherein the short-circuit regions are arranged along a plurality of concentric circles, wherein each of the concentric circles has a different radius about a central axis, wherein the semiconductor device is rotationally symmetrical about the central axis.

21. The semiconductor device of claim 20, wherein a different average density of the short-circuit regions is achieved by varying a difference between the radii of two adjacent concentric circles.

* * * * *